United States Patent
Fujimori-Chen et al.

(10) Patent No.: US 9,008,604 B1
(45) Date of Patent: Apr. 14, 2015

(54) MIXER WITH LINEARIZED INPUT

(75) Inventors: Iliana Fujimori-Chen, Princeton, NJ (US); Ed Balboni, Littleton, MA (US)

(73) Assignee: Analog Devices, Inc., Norwood, MA (US)

(*) Notice: Subject to any disclaimer, the term of this patent is extended or adjusted under 35 U.S.C. 154(b) by 1113 days.

(21) Appl. No.: 13/016,698

(22) Filed: Jan. 28, 2011

Related U.S. Application Data

(60) Provisional application No. 61/299,321, filed on Jan. 28, 2010.

(51) Int. Cl.
*H04B 1/26* (2006.01)
*H04B 1/40* (2006.01)

(52) U.S. Cl.
CPC ........................................ *H04B 1/40* (2013.01)

(58) Field of Classification Search
CPC .. H03D 7/1491; H03D 7/1458; H03D 7/1466
USPC ......... 455/293, 314, 315, 326, 209, 310, 318, 455/333; 327/103, 117, 355–361
See application file for complete search history.

(56) References Cited

U.S. PATENT DOCUMENTS

| | | | |
|---|---|---|---|
| 5,589,791 A | 12/1996 | Gilbert | |
| 5,826,182 A | 10/1998 | Gilbert | |
| 7,782,139 B2 | 8/2010 | Gilbert | |
| 8,089,309 B2* | 1/2012 | Jansen et al. | 327/359 |
| 2007/0077907 A1* | 4/2007 | Rector | 455/323 |
| 2008/0007334 A1* | 1/2008 | Manku | 330/149 |

* cited by examiner

*Primary Examiner* — Tuan Pham
(74) *Attorney, Agent, or Firm* — Marger Johnson & McCollom PC

(57) ABSTRACT

A mixer includes an input stage to convert an RF input signal to an output signal, and a mixer core to mix the output signal from the input stage with a local oscillator signal. The input stage may include an input cell having a first differential pair of cross-connected transistors, and a linearizer coupled to the input cell. The linearizer may include a second differential pair of transistors having first and second inputs coupled to the input terminals and first and second outputs coupled to the output terminals.

23 Claims, 8 Drawing Sheets

MIXER WITH LINEARIZED INPUT

RELATED APPLICATION

This application claims benefit of U.S. Provisional Patent Application Ser. No. 61/299,321 entitled "Mixer with Linearized Input," filed Jan. 28, 2010, which is incorporated by reference.

BACKGROUND

Mixers are specialized modulator circuits that multiply their input signals frequency-pair by frequency-pair, often producing very complex products in the process. A typical mixer includes an input stage, which converts a voltage input to a current mode signal, and a mixer core, which essentially commutates the polarity of the current mode signal in response to a local oscillator signal, although the commutation may not be completely binary.

An important characteristic of a mixer is its small-signal linearity which defined by the 1 dB gain compression and the 3rd order intercept. The input stage of a standard mixer may include a simple differential pair of transistors. The linear range of such an input stage, however, is typically quite small which limits the attainable dynamic range. One prior art technique for extending the linear input range involves the use of multi-tanh input cells which can typically handle larger input signals without significant distortion. See, e.g., U.S. Pat. No. 5,589,791. Another prior art technique for extending the linear input range of a mixer involves the use of a class-AB as shown in U.S. Pat. No. 5,826,182.

DETAILED DESCRIPTION

Figure 1:
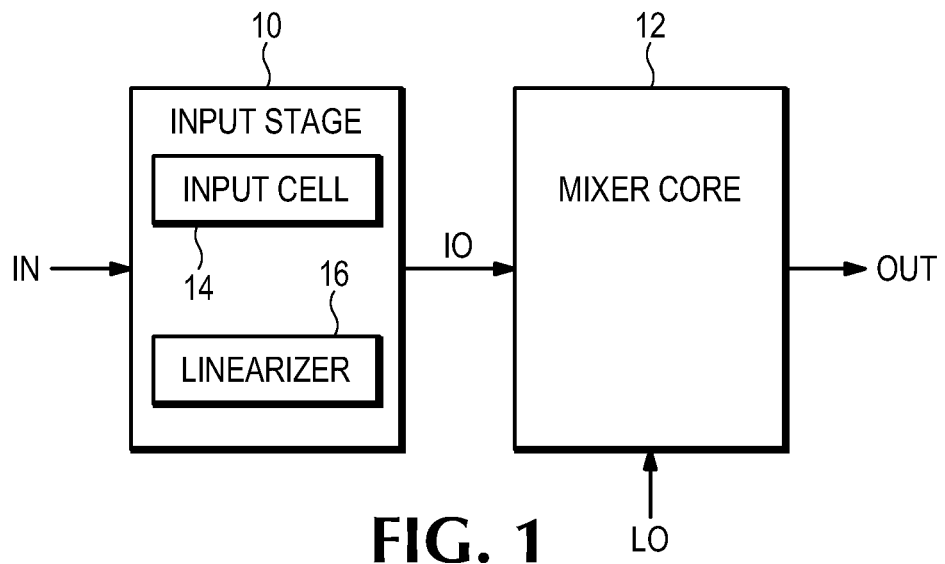
FIG. 1 illustrates an embodiment of a mixer according to some inventive principles of this patent disclosure.

FIG. 1 illustrates an embodiment of a mixer according to some inventive principles of this patent disclosure. The mixer of FIG. 1 includes an input stage 10 that converts an input signal IN to a form that may be used by a mixer core 12. The mixer core 12 mixes the output 10 from the input stage with a local oscillator signal LO to generate the final output signal OUT. The input stage 10 includes an input cell 14 that contributes to processing the input signal IN, and a linearizer 16 that provides a distortion cancellation effect.

Figure 2:
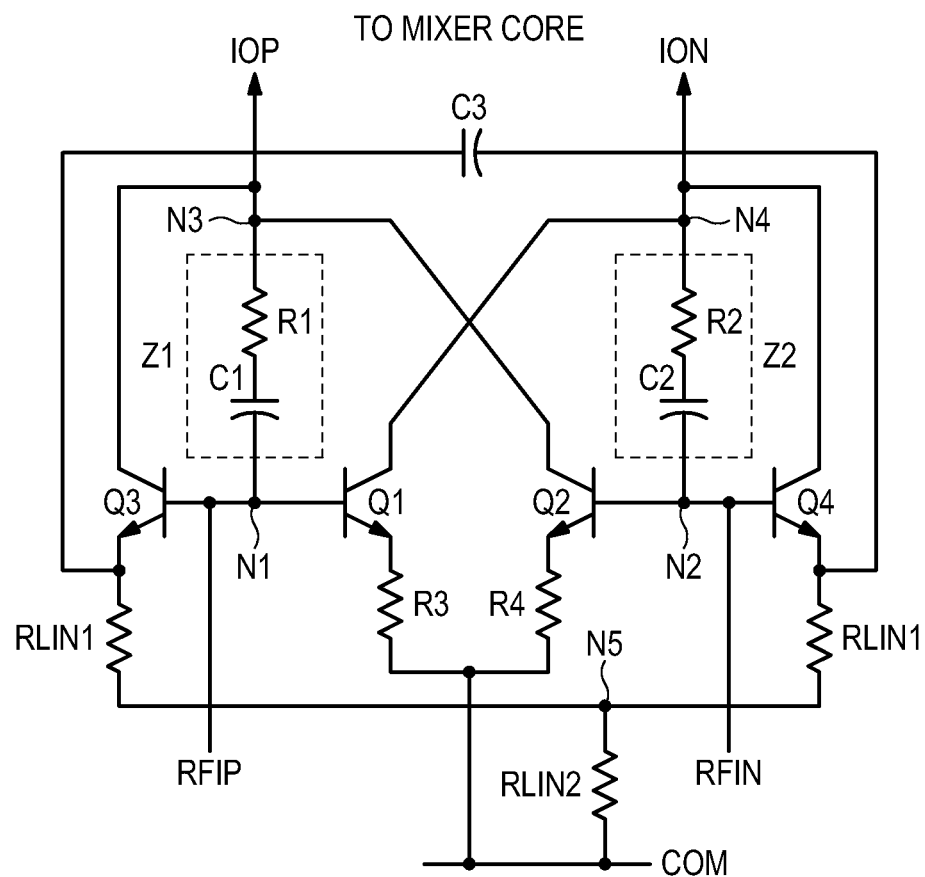
FIG. 2 illustrates an embodiment of an input stage according to some inventive principles of this patent disclosure.

FIG. 2 illustrates an embodiment of an input stage according to some inventive principles of this patent disclosure. The embodiment of FIG. 2 is arranged in a voltage-to-current converter configuration and may be used, for example, to implement the input stage 10 of FIG. 1.

In the embodiment of FIG. 2, a differential input RFIP/N is received at nodes N1 and N2 and coupled to a differential output IOP/N at nodes N3 and N4 through impedances $Z_1$ and $Z_2$. In this example, the impedances $Z_1$ and $Z_2$ include series RC networks $R_1C_1$ and $R_2C_2$, respectively. A differential pair of transistors Q1 and Q2 form an input cell in which the bases of Q1 and Q2 are connected to input nodes N1 and N2, respectively, while the collectors of Q1 and Q2 are cross-connected to nodes N4 and N3, respectively. The emitters of Q1 and Q2 are connected to a common node COM through resistors R3 and R4. The input impedance looking into nodes N1 and N2 is defined by R1 and R2. For example, R1 and R2 may each be set to 25Ω to provide a 50Ω input impedance.

Transistors Q3 and Q4 are arranged as a linearizer to cancel third-order distortion terms from transistors Q1 and Q2. The bases of Q3 and Q4 are connected to the bases of Q1 and Q2, respectively, while the collectors of Q3 and Q4 are connected to output nodes N3 and N4, respectively. The emitters of Q3 and Q4 are connected through two resistors with value $R_{LIN1}$ to a node N5, which in turn is connected to the common node COM through another resistor $R_{LIN2}$. A capacitor C3 is connected between the emitters of Q3 and Q4 to facilitate adjustment of the phase of the linearizer transconductance.

DC bias current may be established in the circuit of FIG. 2, for example, by applying a bias voltage to nodes N1 and N2 through suitable resistors. Capacitors C1 and C2 may provide isolation from the input voltage to the output voltage. Additional DC blocking capacitors may be used to isolate the input voltage from the source of the bias voltage.

The overall transconductance gm (output current/input voltage) of the input stage can be expressed as:

$$gm = gm1 - gm4 + gm2 - gm3 \qquad \text{(Eq. 1)}$$

where gm1/2/3/4 represent the degenerated transconductance of transistors Q1/2/3/4, respectively. The degeneration resistors with value RLIN1 as well as bias current through RLIN2 may be adjusted to optimize the magnitude of gm3/4, and ultimately improve the input third-order intercept point (IIP3).

Figure 3:
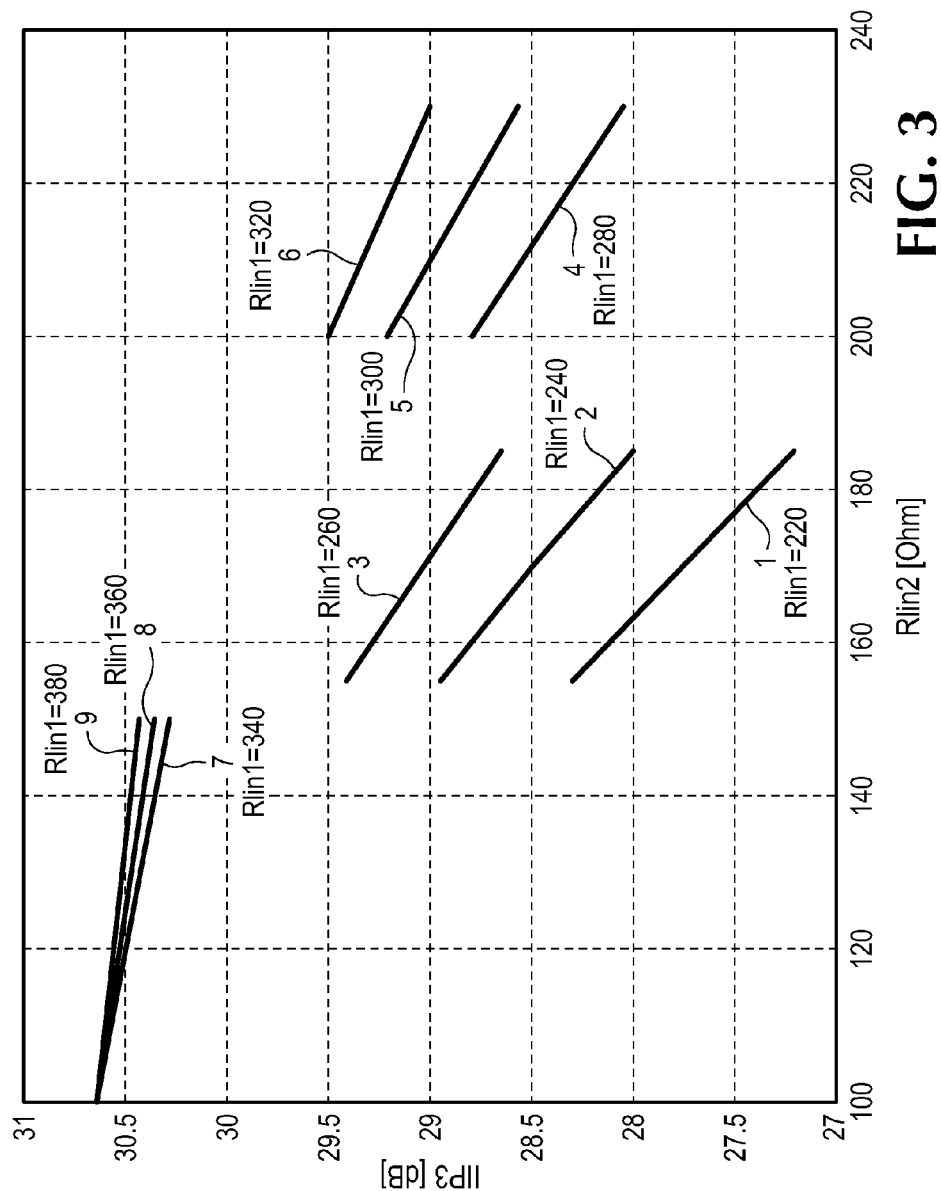
FIGS. 3 and 4 illustrate some example curves illustrating the operation of the embodiment of FIG. 2.

Depending on the implementation details, the values of RLIN1 and RLIN2 may have various effects on the third-order intercept. FIG. 3 illustrates some example curves showing the dependency of IIP3 on RLIN1 and RLIN2 at a given frequency, which in this example is 550 MHz, and at a given bias current. In general, IIP3 increases as RLIN2 decreases, and IIP3 also increases as RLIN1 increases. However, as RLIN2 continues to decrease, and the current through the linearizer transistors increases, the value of IIP3 becomes less sensitive to the value of RLIN1.

Figure 4:
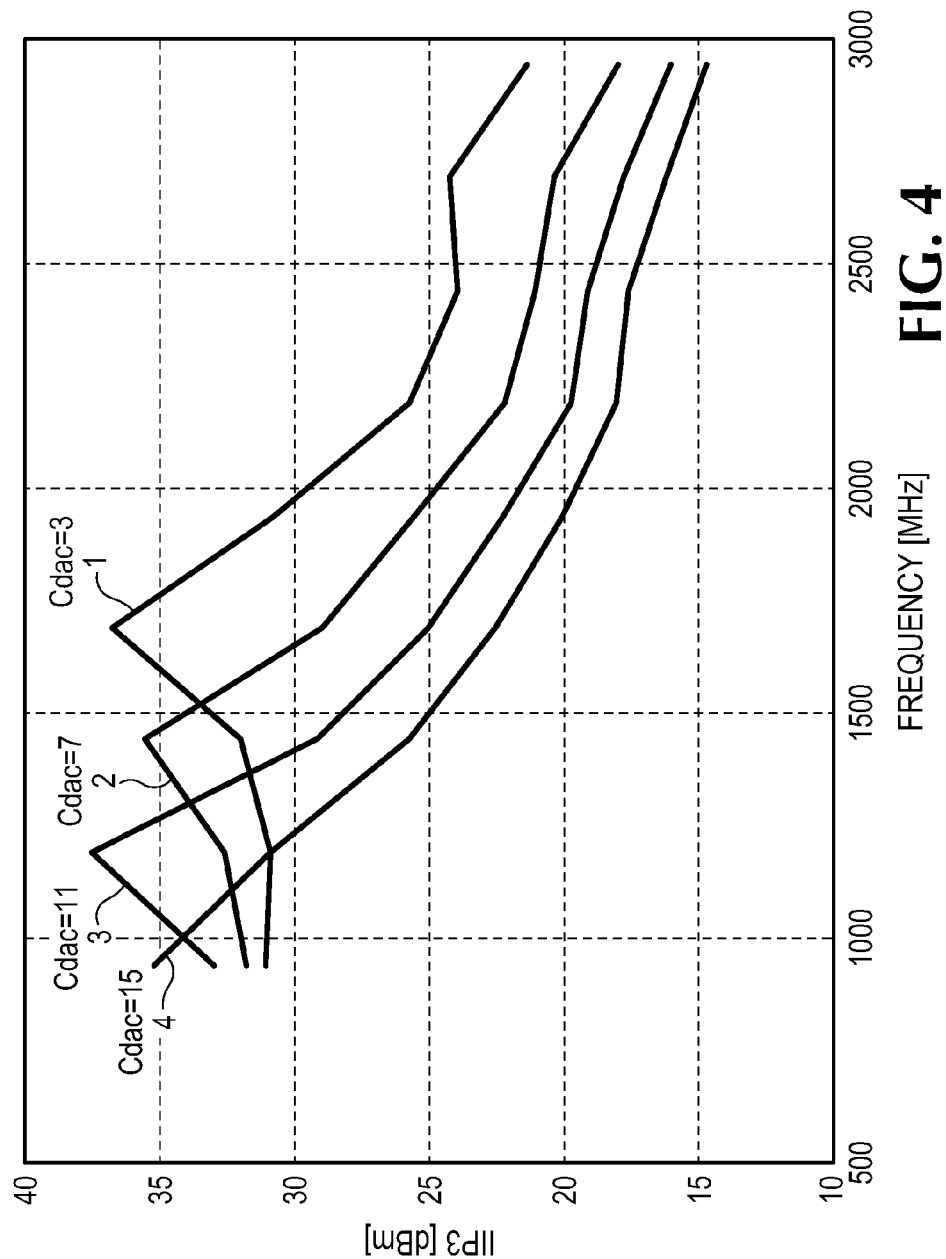

In addition to adjusting the magnitude of the linearizer transconductance, the phase of Q3 and Q4 may also be optimized to obtain more complete cancellation of third-order distortion terms over a wide frequency range. This may be accomplished by adjusting the value of C3 which is connected between the emitters of Q3 and Q4. FIG. 4 illustrates how IIP3 can be optimized, e.g., maximized, for a given frequency range based on the value of C3 at a given bias current. Depending on the implementation details, C3 may provide greater improvement within certain frequency ranges. Capacitor C3 may also be more effective with higher mixer core currents.

The cross-coupling of the input differential pair Q1 and Q2 may provide double the gain of a simple differential pair without cross-coupling. An increase in RFIP leads to a decrease in the negative output voltage V(ION) through Q1, while a decrease in RFIN also leads to a decrease in V(ION) through the input impedance.

Another potential advantage is that the mixer core current may be arranged to flow through the emitter degeneration resistors R3 and R4 for transistors Q1 and Q2. This may reduce or eliminate current flow through the RF inputs, thereby allowing a wider selection of input balanced-unbalanced (balun) converters.

Figure 5:
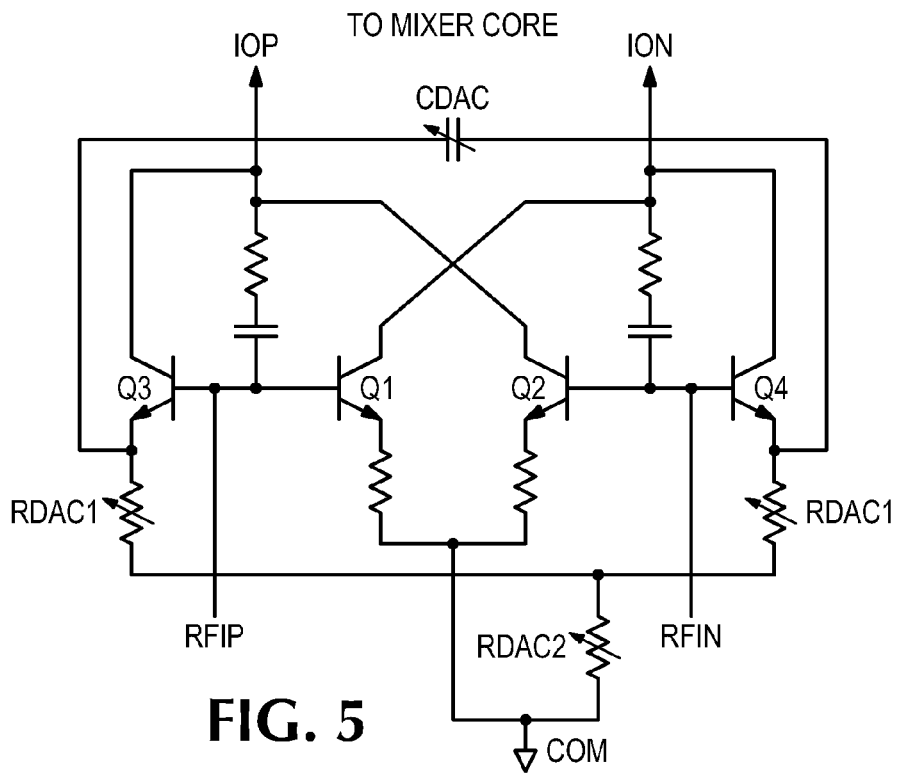
FIG. 5 illustrates another embodiment of an input stage according to some inventive principles of this patent disclosure.

FIG. 5 illustrates another embodiment of an input stage according to some inventive principles of this patent disclosure. The embodiment of FIG. 5 is similar to the embodiment of FIG. 2, but C3, RLIN1 and RLIN2 are replaced with variable components CDAC, RDAC1 and RDAC2, respectively. This enables the magnitude of the linearizer transconductance and/or the phase to be adjusted for different operating frequencies and bias currents. These components may be made variable through any suitable technique. For example, in a monolithic implementation, these components may be connected via fuses to be blown or kept, and thus, adjustable by a user. Alternatively, they may be implemented as continuously or digitally adjustable components.

Figure 6:
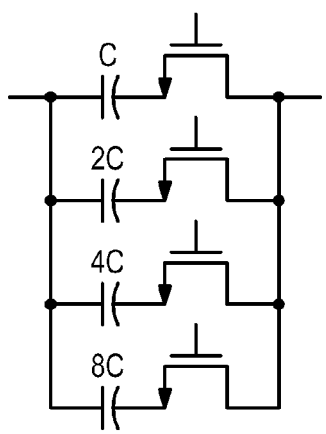
FIG. 6 illustrates an example implementation of a digitally adjustable capacitor network suitable for use with the embodiment of FIG. 5.

FIG. 6 illustrates an example implementation of a digitally adjustable capacitor network suitable for use as CDAC. Various combinations of the capacitors may be selected by driving the gates of the MOS transistors high or low. The capacitors in FIG. 6 are shown with binary weighting for convenience of selecting values, but any other weighting may be used, and any number of bits may be used.

Figure 7:
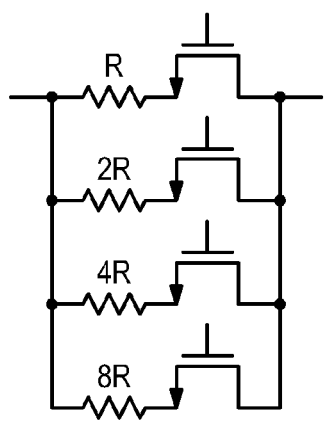
FIG. 7 illustrates an example implementation of a digitally adjustable resistor network suitable for use with the embodiment of FIG. 5.

FIG. 7 illustrates an example implementation of a digitally adjustable resistor network suitable for use as RDAC1 and/or RDAC2. Various combinations of the resistors may be selected by driving the gates of the MOS transistors high or low. The resistors in FIG. 7 are shown with binary weighting for convenience of selecting values, but any other weighting may be used, and any number of bits may be used.

Figure 8:
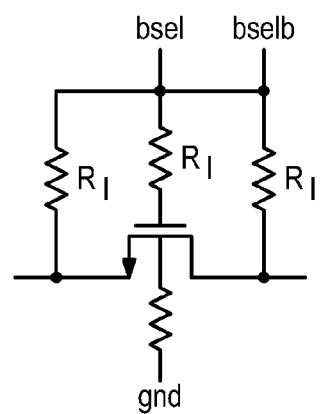
FIG. 8 illustrates an embodiment of a technique for isolating the transistor switches shown in FIGS. 6-7.

FIG. 8 illustrates an embodiment of a technique for isolating transistor switches such as those shown above in FIGS. 6-7. The isolation resistors $R_I$ between the complementary select lines bsel/bselb serve to isolate the transistor switches from noise that may be present on select lines.

Figure 9:
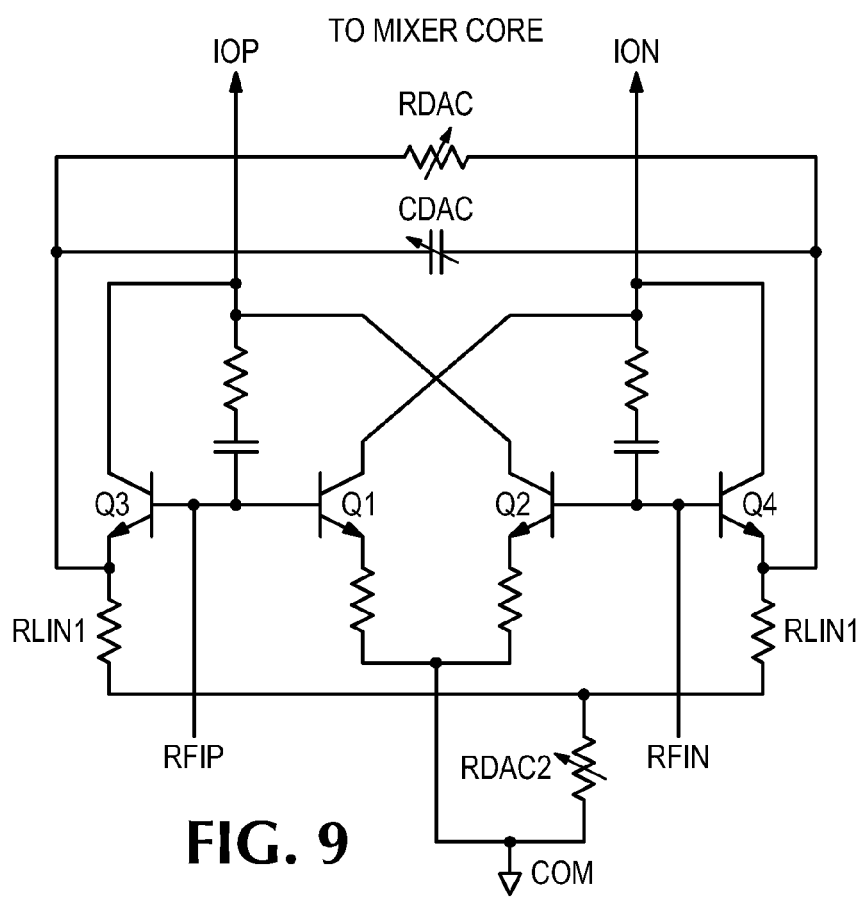
FIG. 9 illustrates another embodiment of an input stage according to some inventive principles of this patent disclosure.

FIG. 9 illustrates another embodiment of an input stage according to some inventive principles of this patent disclosure. The embodiment of FIG. 9 is similar to the embodiment of FIG. 5, but resistors RLIN1 are now fixed components, and a variable resistor RDAC is coupled between the emitters of Q3 and Q4. This may be beneficial for example, to retain the adjustability provided by RDAC1 in FIG. 5, but in an inherently balanced configuration that eliminates any inaccuracies due to differences between the two different RDAC1 components.

Figure 10:
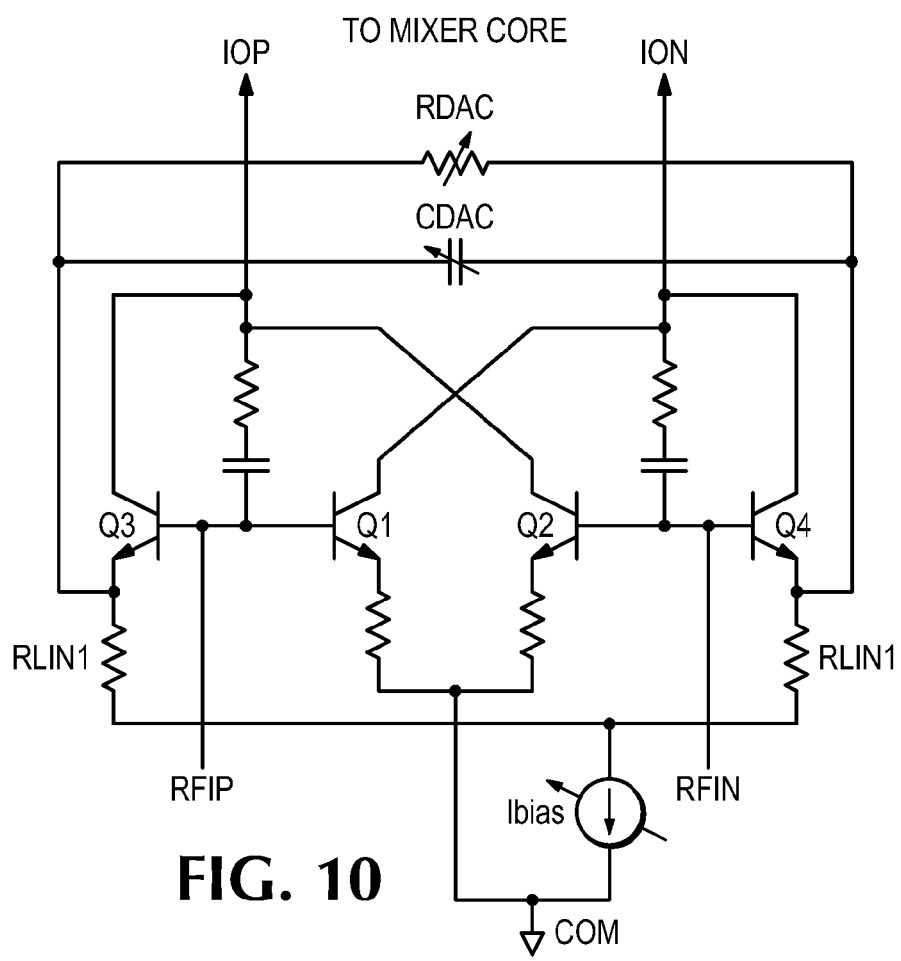
FIG. 10 illustrates another embodiment of an input stage according to some inventive principles of this patent disclosure.

FIG. 10 illustrates another embodiment of an input stage according to some inventive principles of this patent disclosure. The embodiment of FIG. 10 is similar to the embodiment of FIG. 9, but the fixed resistor RLIN2 is replaced with an adjustable current source Ibias.

Figure 11:
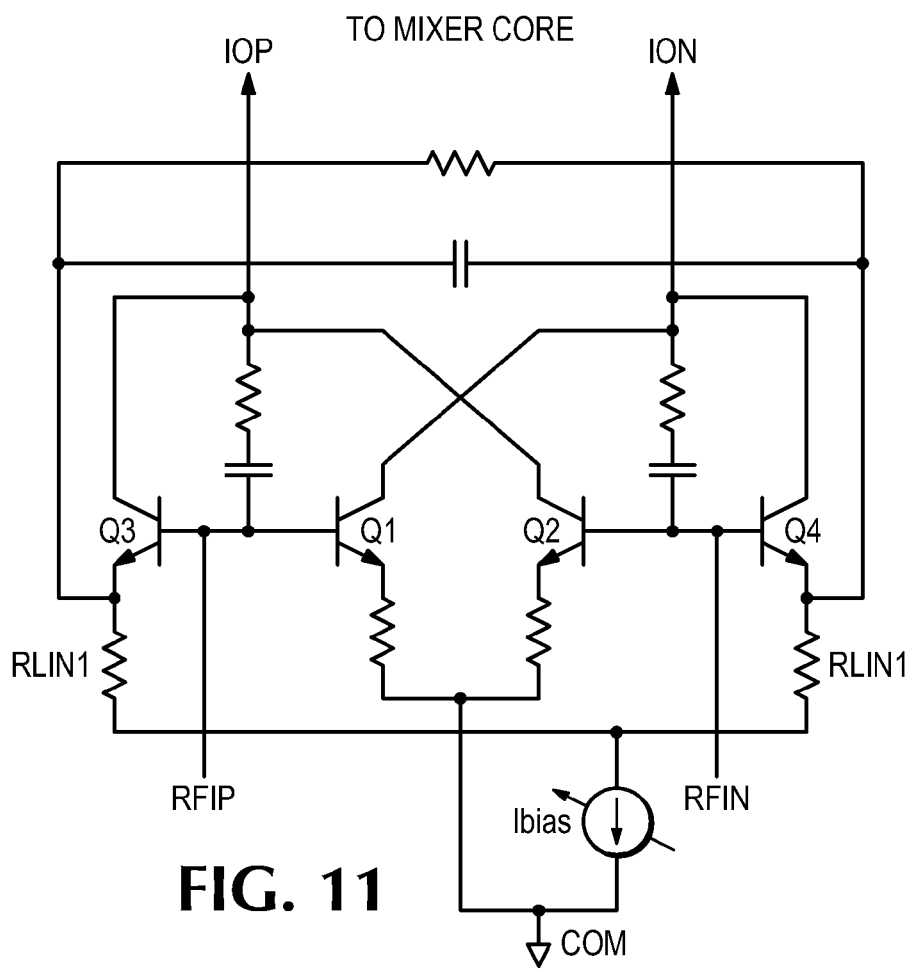
FIG. 11 illustrates another embodiment of an input stage according to some inventive principles of this patent disclosure.

FIG. 11 illustrates another embodiment of an input stage according to some inventive principles of this patent disclosure. The embodiment of FIG. 11 is similar to the embodiment of FIG. 10, but the variable components RDAC and CDAC are replaced with fixed components.

The various combinations of components in the embodiments described above may enable optimization of the input stage and/or mixer core depending on the specific application. For example, in some implementations, it may be beneficial to use a resistor rather than current source for Ibias because of better linearity and/or reduced noise from a current source transistor. In other implementations, it may be preferable to have the flexibility of a continuously variable current source.

Figure 12:
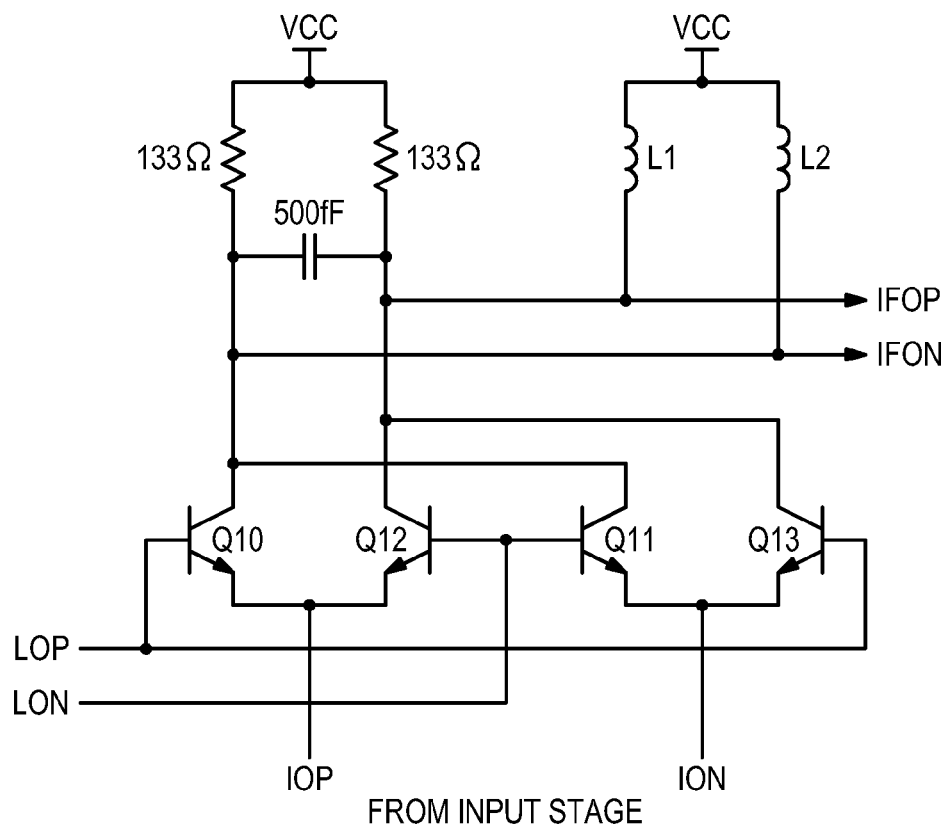
FIG. 12 illustrates a mixer core that may be suitable for use with the input stages described above according to some inventive principles of this patent disclosure.

Although the inventive principles relating to input stages are not limited to any particular mixer core, FIG. 12 illustrates a mixer core that may be suitable for use with the input stages described above according to some inventive principles of this patent disclosure. In the embodiment of FIG. 12, any suitable components such as inductors L1 and L2 may be implemented as external components.

The embodiments described herein can be modified in arrangement and detail without departing from the inventive concepts. For example, some embodiments have been described and illustrated in the context of BJT transistors of specific polarities, but the same inventive principles may be realized in other embodiments with CMOS or J-FET transistors, with different polarities, etc. Thus, references to various elements and configurations of one type of transistor also encompasses the corresponding elements and configurations of other types of transistors, e.g., emitter-follower is understood to also refer to source-follower, emitter degeneration also refers to source degeneration, base is understood to also refer to gate, etc. Accordingly, such changes and modifications are considered to fall within the scope of the following claims.

The invention claimed is:

1. A mixer comprising:
   an input stage to convert an RF input signal to an output signal; and
   a mixer core to mix the output signal from the input stage with a local oscillator signal;
   where the input stage comprises:
      an input cell having a differential pair of cross-connected transistors;
      a linearizer having a second differential pair of transistors coupled to the input cell, wherein the inputs of the pair of cross-connected transistors are connected to the inputs of the pair of transistors in the linearizer; and
      a first impedance coupled between a first one of the inputs and a first output of the differential pair of cross-connected transistors; and
      a second impedance coupled between a second one of the inputs and a second output of the differential pair of cross-connected transistors.

2. The mixer of claim 1 where the first and second inputs of the differential pair of transistors are cross-coupled to the first and second input terminals.

3. The mixer of claim 1 where the differential pair of transistors includes emitter degeneration.

4. The mixer of claim 1 where the differential pair of transistors comprises:
   a first transistor having a first terminal coupled to the first input terminal, a second terminal coupled to the first output terminal, and a third terminal coupled to a common node; and a second transistor having a first terminal coupled to the second input terminal, a second terminal coupled to the second output terminal, and a third terminal coupled to the common node.

5. The mixer of claim 4 where the differential pair of transistors further comprises:
   a first resistor coupled between the third terminal of the first transistor and the common node; and
   a second resistor coupled between the third terminal of the second transistor and the common node.

6. The mixer of claim 1 where:
   the first impedance comprises a first resistor and a first capacitor; and
   the second impedance comprises a second resistor and a second capacitor.

7. The mixer of claim 6 where:
   the first resistor and first capacitor are coupled in series; and
   the second resistor and second capacitor are coupled in series.

8. The mixer of claim 2 where the second differential pair of transistors have first and second inputs coupled to the input terminals and first and second outputs coupled to the output terminals.

9. The mixer of claim 4 where the linearizer comprises:
   a third transistor having a first terminal coupled to the first input terminal, a second terminal coupled to the first output terminal, and a third terminal coupled to the common node; and
   a fourth transistor having a first terminal coupled to the second input terminal, a second terminal coupled to the second output terminal, and a third terminal coupled to the common node.

10. The mixer of claim 9 where the third terminals of the third and fourth transistors are coupled to the common node through one or more resistors.

11. The mixer of claim 9 further comprising a capacitance coupled between the third terminals of the third and fourth transistors.

12. The mixer of claim 11 where the capacitance is adjustable.

13. The mixer of claim 12 where the capacitance includes multiple capacitors arranged to be selected by transistor switches.

14. The mixer of claim 1 where the linearizer may be adjusted for different operating frequencies.

15. The mixer of claim 14 where the linearizer includes a variable capacitor to adjust the linearizer for different operating frequencies.

16. The mixer of claim 1 where:
   the differential pair of transistors has a bias current; and
   the bias current can be controlled by biasing the voltage of the first and second input terminals.

17. The mixer of claim 1 where the first and second impedances are arranged to determine the input impedance of the input stage.

18. An input stage comprising:
   first and second input terminals;
   first and second output terminals;
   a first transistor having a first terminal coupled to the first input terminal and a second terminal coupled to the second output terminal;
   a second transistor cross-connected to the first transistor having a first terminal coupled to the second input terminal and a second terminal coupled to the first output terminal;
   a third transistor of a differential pair of transistors having a first terminal coupled to the first input terminal and a second terminal coupled to the first output terminal;
   a fourth transistor of the differential pair of transistors having a first terminal coupled to the second input terminal and a second terminal coupled to the second output terminal;
   a first impedance coupled between the first input terminal and the first output terminal; and
   a second impedance coupled between the second input terminal and the second output terminal.

19. The input stage of claim 18 where the first, second, third and fourth transistors have third terminals coupled to a common node.

20. The input stage of claim 19 where:
   the first impedance comprises a first resistor and a first capacitor; and
   the second impedance comprises a second resistor and a second capacitor.

21. The input stage of claim 20 where:
   the first resistor and first capacitor are coupled in series; and
   the second resistor and second capacitor are coupled in series.

22. The input stage of claim 18 further comprising a capacitor coupled between third terminals of the third and fourth transistors.

23. An input stage comprising:
   an input cell having a differential pair of cross-connected transistors;
   a linearizer having a differential pair of transistors;
   where the inputs of the pair of cross-connected transistors are connected to the inputs of the pair of transistors in the linearizer;
   a first impedance coupled between a first one of the inputs and a first output of the differential pair of cross-connected transistors; and
   a second impedance coupled between a second one of the inputs and a second output of the differential pair of cross-connected transistors.

* * * * *